United States Patent
Rost et al.

(10) Patent No.: US 6,924,208 B2
(45) Date of Patent: Aug. 2, 2005

(54) DUAL MASK CAPACITOR FOR INTEGRATED CIRCUITS

(75) Inventors: Timothy A. Rost, Plano, TX (US); Edmund Burke, Dallas, TX (US); Satyavolu S. Papa Rao, Garland, TX (US); Rose Alyssa Keagy, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 10/831,471

(22) Filed: Apr. 23, 2004

(65) Prior Publication Data

US 2005/0063138 A1 Mar. 24, 2005

Related U.S. Application Data

(62) Division of application No. 10/669,847, filed on Sep. 24, 2003.

(51) Int. Cl.[7] .............................................. H01L 21/20
(52) U.S. Cl. ..................... 438/399; 438/239; 438/250; 438/253; 257/68; 257/71
(58) Field of Search ................. 438/399, 239, 438/250, 253; 257/68, 71, 300, 371

(56) References Cited

U.S. PATENT DOCUMENTS 5,563,762 A * 10/1996 Leung et al. ............ 361/301.4

* cited by examiner

*Primary Examiner*—David Nelms
*Assistant Examiner*—Long Tran
(74) *Attorney, Agent, or Firm*—Jacqueline J. Garner; W. James Brady, III; Frederick J. Telecky, Jr.

(57) ABSTRACT

An embodiment of the invention is a capacitor comprising a bottom electrode 70 coupled to a first interconnect 30a of the top metal level 10, a capacitor dielectric 90, sidewalls 105, and a top electrode 110 coupled to a second interconnect 30b of the top metal level 10. Another embodiment of the invention is a method of manufacturing a capacitor using a first mask 140 to form a material stack that includes a bottom electrode 70 coupled to a first interconnect 30a of the top metal level 10, a capacitor dielectric 90, and a partial top electrode 100. The method further includes using a second mask 150 to form a complete top electrode coupled to a second interconnect 30b of the top metal level 10.

31 Claims, 5 Drawing Sheets

DUAL MASK CAPACITOR FOR INTEGRATED CIRCUITS

This is a division of application Ser. No. 10/669,847, filed Sep. 24, 2003, the entire disclosure of which is hereby incorporated by reference.

CROSS-REFERENCE TO RELATED APPLICATIONS

This application is related to patent application Ser. No. 10/670,037 (filed simultaneously with this patent application) entitled "High Capacitive Density Stacked Decoupling Capacitor Structure"; patent application Ser. No. 10/335,333 (filed Dec. 31, 2002) entitled "MIM Capacitors and Methods for Fabricating Same"; patent application Ser. No. 10/638,596 (filed Aug. 11, 2003) entitled "MIM Capacitors and Methods for Fabricating Same"; and patent application Ser. No. 10/697,138 (filed Oct. 30, 2003) entitled "Capacitor Integration at Top-Metal Level With a Protective Cladding For Copper Surface Protection". With their mention in this section, these patent applications are not admitted to be prior art with respect to the present invention.

BACKGROUND OF THE INVENTION

This invention relates to a capacitor that can be integrated into top metal level interconnect layer of an integrated circuit.

DETAILED DESCRIPTION OF THE INVENTION

The present invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown In detail to avoid obscuring the invention.

Figure 1A:
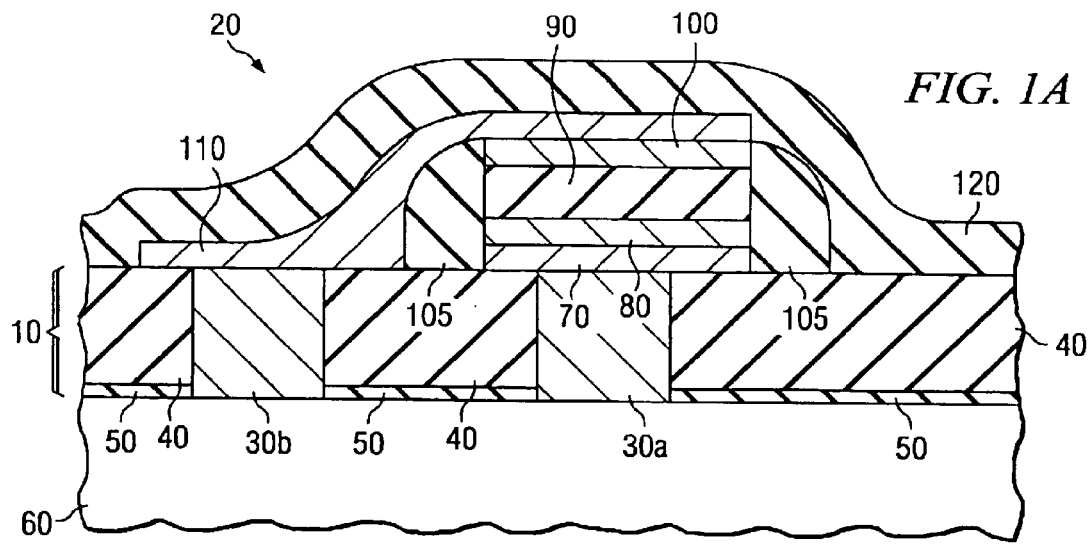
FIG. 1A-1B are a cross-sectional views of a dual mask capacitor in accordance with the present invention.

Referring to the drawings, FIG. 1A is a cross-sectional view of a dual mask capacitor in a partially fabricated semiconductor wafer in accordance with the present invention. More specifically, FIG. 1A shows a dual mask high density capacitor that is formed above the top metal level interconnect layer 10 of a semiconductor wafer 20. The capacitor shown in FIG. 1A may more generally be considered a top metal level capacitor.

In the example application shown in FIG. 1A, the top metal level 10 is a single damascene metal interconnect layer. However, it is within the scope of the invention to form the dual mask capacitor over other interconnect structures such as a dual damascene metal interconnect layer.

The single damascene metal interconnect layer 10 shown in FIG. 1A contains metal interconnects 30a, 30b that properly route electrical signals or power throughout the integrated circuit. In the example application, the metal interconnects 30a, 30b are comprised of Cu. The single damascene metal interconnect layer 10 also contains regions of dielectric material 40 that electrically insulate the metal interconnects 30a, 30b. The dielectric material is preferably comprised of any low-k material, such as Organo-Silicate Glass ("OSG") or Fluorinated Silicon Glass ("FSG"). In addition, the single damascene metal interconnect layer 10 may contain a dielectric barrier layer 50. If present, the barrier layer 50 functions as an etch stop layer and may be comprised of a material such as SiC.

The single damascene metal interconnect layer 10 is the top metal level formed over a semiconductor body 60. Semiconductor body 60 usually contains other metal interconnect levels that are located below—and are probably electrically interconnected to—the top metal level 10. Together, the metal interconnect levels properly route power and electrical signals throughout the integrated circuit. The semiconductor body 60 also contains a device level that is located below the metal interconnect levels. The device level may contain passive elements and active elements such as transistors. Moreover, the device level may contain various well and substrate technologies.

Only the top metal level 10 is shown in FIG. 1A for simplicity. In the best mode application the metal interconnects 30a and 30b are power and ground lines. As a result, the interconnect routing in the top metal level 10 is not as dense as the interconnect routing in the lower metal interconnect levels. Therefore, more space is available for the decoupling capacitors that are connected to the top metal level. In the best mode application the dual mask capacitor is a decoupling capacitor; however, it is within the scope of the invention to form dual mask capacitors that perform other functions such as a RF capacitor (i.e. analog capacitors). The use of the dual mask capacitor over the top metal level in RF applications results in a reduced parasitic capacitance compared to other locations.

The dual mask capacitor is configured in an over-metal application. More specifically, the dual mask capacitor is completely connected to the integrated circuit through its underlying metal interconnect layer. Therefore, the dual mask capacitor configuration is not dependent on the use of a subsequent metal cap layer (or metal interconnect layer) and is thereby compatible with any packaging technology.

Referring again to FIG. 1A, the dual mask capacitor includes a bottom electrode comprised of layers 70 and 80, a capacitor dielectric 90, and a top electrode comprised of layers 100 and 110. In the best mode application, the first layer 70 of the bottom electrode is comprised of TaN. This material is used in the best mode application because it is compatible with copper processes and it acts as an effective barrier to the out-diffusion of copper from the metal lines 30a into the capacitor dielectric. The next layer 80 of the bottom electrode is comprised of TiN. This material is used in the best mode application to take advantage of the higher capacitance density obtained with a $TiN/TaO_x$ interface as opposed to a $TaN/TaO_x$ interface, since the TiN is less susceptible to oxidation during the deposition of the $TaO_x$.

The capacitor dielectric 90 is comprised of $TaO_x$ in the best mode application. However, other high-k dielectrics such as $HfO_x$ may be used.

Figure 1B:
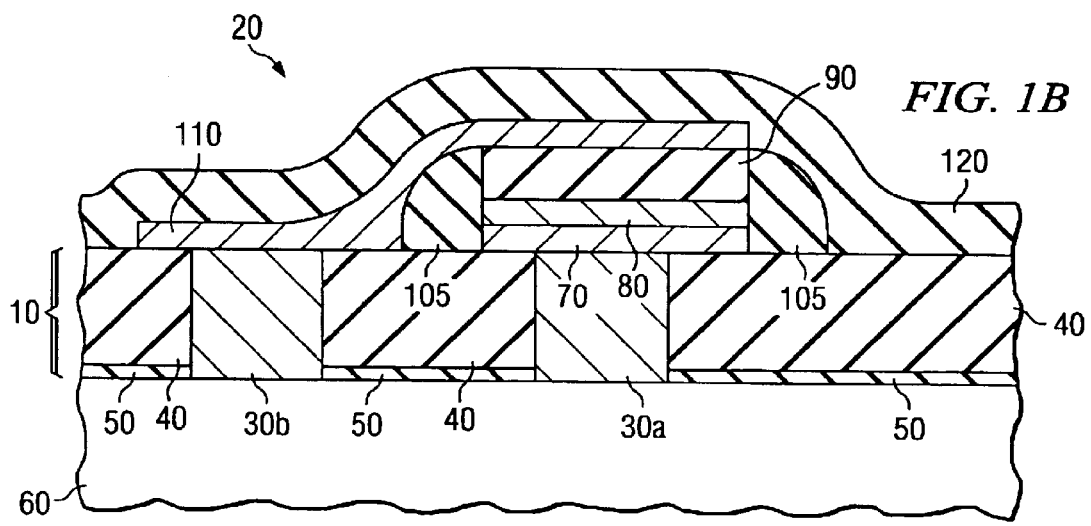

In the best mode application, the top electrode includes a layer of TiN 100 and a layer of TaN 110. Depending on the process technique used to create the capacitor dielectric 90, the top electrode may also contain impurities (i.e. carbon, hydrogen, and nitrogen). The top electrode layer 110 is TaN in the best mode application because it is compatible with copper processes and it acts as an effective barrier to the out-diffusion of copper from the metal lines 30b into the capacitor dielectric. The top electrode layer 100 is comprised of TiN in the best mode application to take advantage of the higher capacitance density obtained with a TiN/TaO$_x$ interface as opposed to a TaN/TaO$_x$ interface. However, the use of the TiN layer 100 is optional, as shown in FIG. 1B and described more fully below.

The dual mask capacitor is located over the top metal level 10 such that the bottom electrode 70 of the dual mask capacitor is electrically coupled to a first interconnect 30a of the top metal level 10. In addition, the top electrode 110 of the dual mask capacitor is electrically coupled to a second interconnect 30b of the top metal level 10. In the best mode application, the dual mask capacitor functions as a decoupling capacitor and the first interconnect 30a is the power rail while the second interconnect 30b is ground.

Sidewalls 105 are located on the sides of the dual mask capacitor and provide electrical isolation between the bottom electrode 70, 80 and the top electrode 100, 110. Therefore, the sidewalls 105 protect against electrical shorting between the top and bottom electrodes of the dual mask capacitor. In addition the sidewalls 105 control the substrate parasitic capacitance in circuit designs where the dual mask capacitor functions as an analog capacitor.

A protective overcoat 120 is formed on top of the semiconductor wafer 20. The protective overcoat 120 is generally comprised of an etch stop portion and an overcoat portion. Both portions are preferably comprised of SiO$_2$; however, any suitable dielectric material may be used.

Figure 2A:
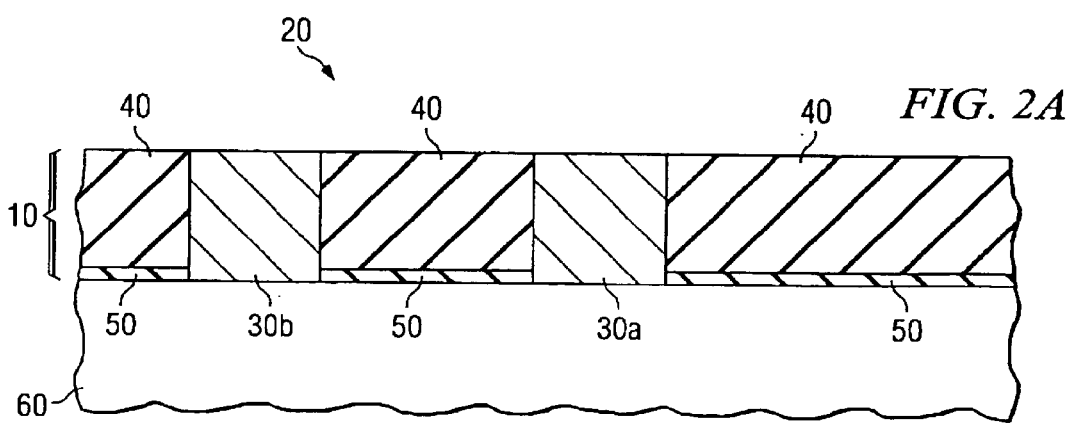
FIG. 2A-2I are cross-sectional views of the dual mask capacitor of FIG. 1A at various stages of fabrication.

Referring again to the drawings, FIGS. 2A–2I are cross-sectional views of the dual mask capacitor shown in FIG. 1A at various stages of fabrication. First, a semiconductor body 60 is fabricated up to the completion of the top metal interconnect level 10, as shown in FIG. 2A. The process steps used to fabricate the semiconductor wafer 200 until this stage are those standard in the industry. The last step in the manufacture of the top metal level 10 is generally copper chemical-mechanical polish ("Cu CMP"). Cu CMP is performed to planarize the surface of the semiconductor wafer 20 and to remove the excess copper and dielectric materials, and also fashion the inlaid metal lines 30a, 30b.

Figure 2B:
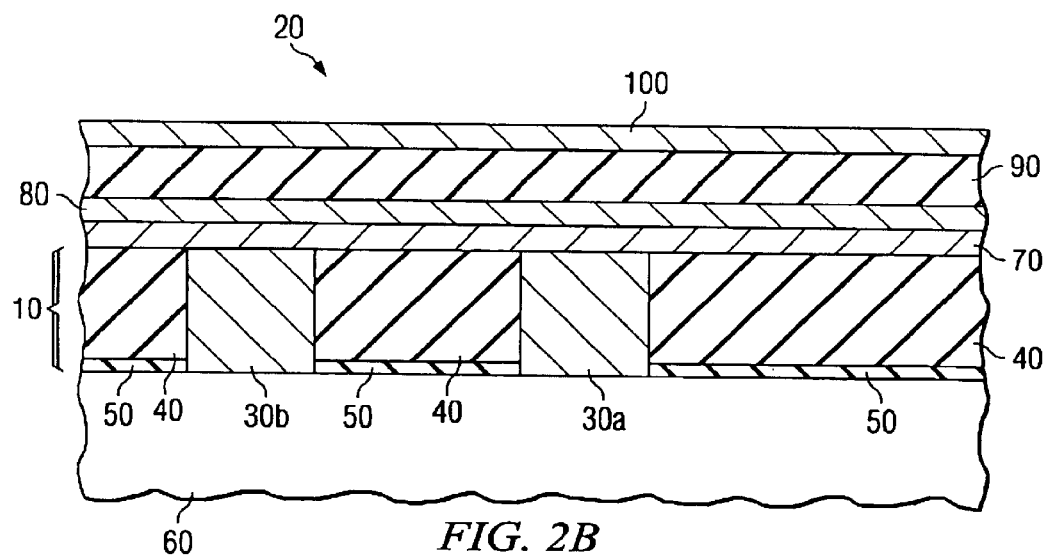

Referring to FIG. 2B, a layer 70 of TaN is now formed over the semiconductor wafer 20. The layer of TaN may be formed using any suitable manufacturing process such as physical vapor deposition ("PVD"). Next a layer 80 of TiN is formed over the semiconductor wafer 20. The layer of TiN may also be formed using any suitable manufacturing process such as physical vapor deposition ("PVD").

Next, a layer of TaO$_x$ is formed over the layer of TiN 80 using any suitable manufacturing process such as chemical vapor deposition ("CVD"). The TiN layer 80 reduces oxidation of the bottom electrode layer 70 and therefore reduces the leakage of the dual mask capacitor. The layer of TaO$_x$ is annealed in activated oxygen radicals to increase the oxygen content (i.e. the value of x is typically increased to values between 2 and 3) and decrease the impurities of the capacitor dielectric 90.

In the best mode application, a second layer 100 of TiN is deposited over the semiconductor wafer 20 using any suitable manufacturing process such as PVD. If used, this second layer 100 of TiN will eventually form part of the top electrode; however, the formation of this second layer 100 of TiN is optional.

Figure 2C:
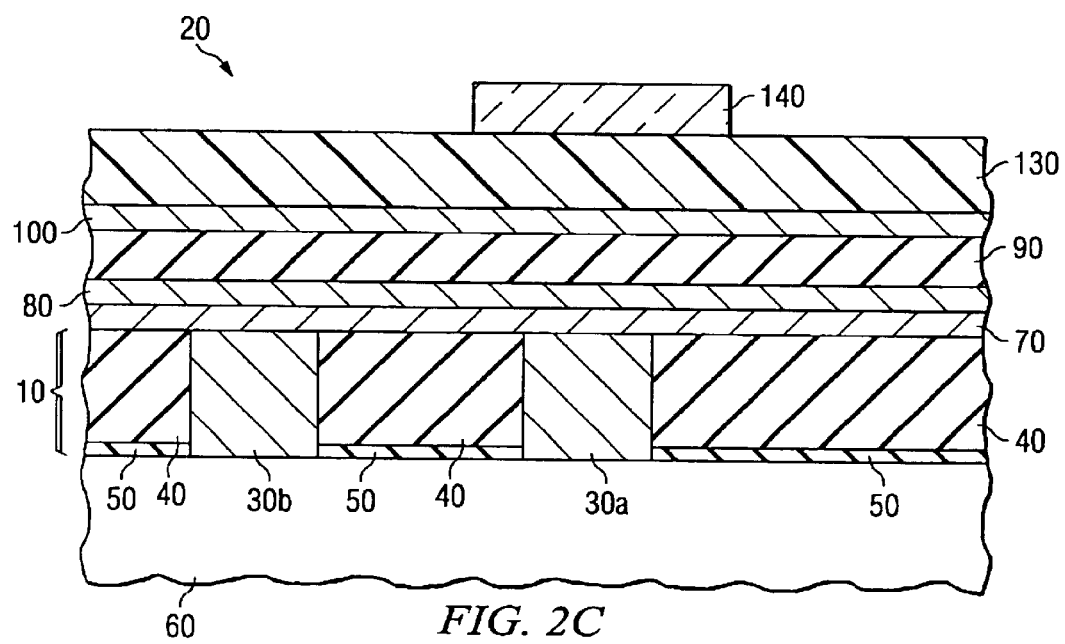

Referring to FIG. 2C, a layer 130 of photoresist is applied over the semiconductor wafer 20. Then the photoresist layer 130 is patterned with a lithography process using a first mask 140. This first mask 140 defines the outline of the capacitor stack. The capacitor stack is situated over a first interconnect 30a of the top metal level 10; thereby creating an electrical connection between the bottom electrode layer 70 of the capacitor stack and the first interconnect 30a of the top metal level 10.

Figure 2D:
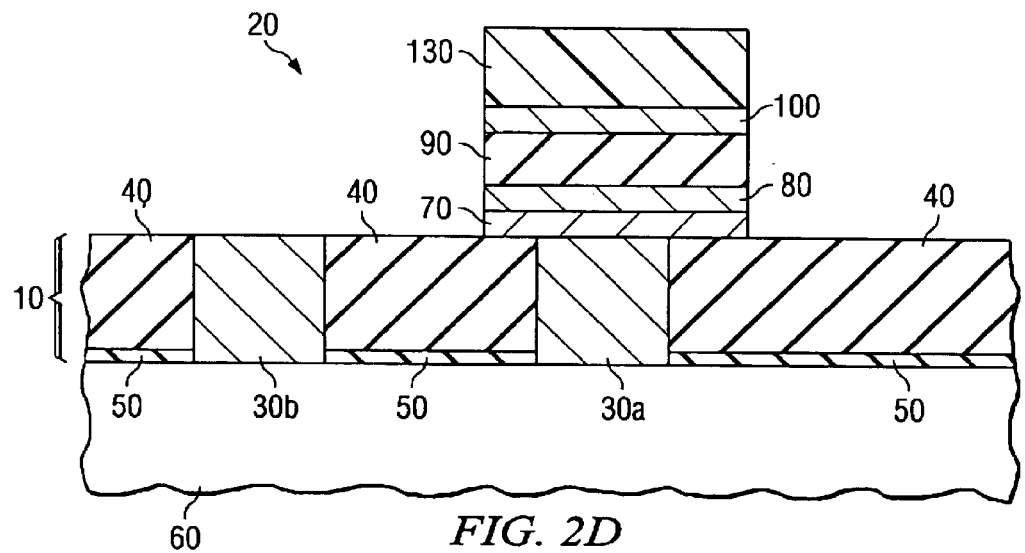

Next, as shown in FIG. 2D, the capacitor stack is etched using the patterned photoresist 130. Any well-known plasma etch process, such as fluorocarbon-based plasma etch with an Ar additive, may be used to create the capacitor stack.

Figure 2E:
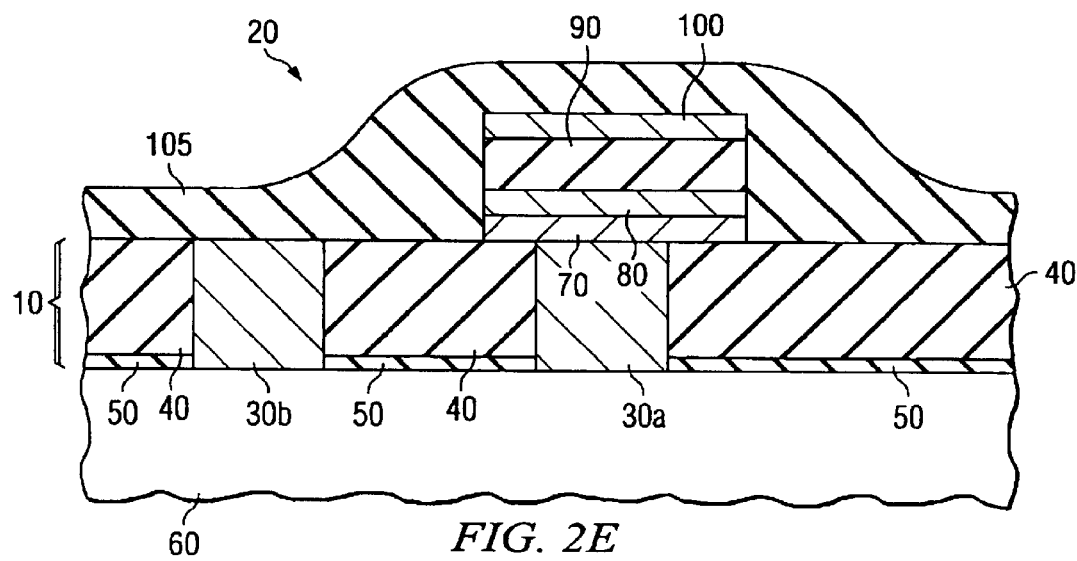

The photoresist pattern is removed with an ash process and now a layer 105 of dielectric is formed over the semiconductor wafer, as shown in FIG. 2E. In the best mode application, the dielectric material is SiO$_2$; however, other materials such as SiN or tetraethylorthosilicate ("TEOS") may be used. The dielectric layer 105 may be applied through any well known manufacturing process such as CVD or plasma-enhanced chemical vapor deposition ("PECVD").

Figure 2F:
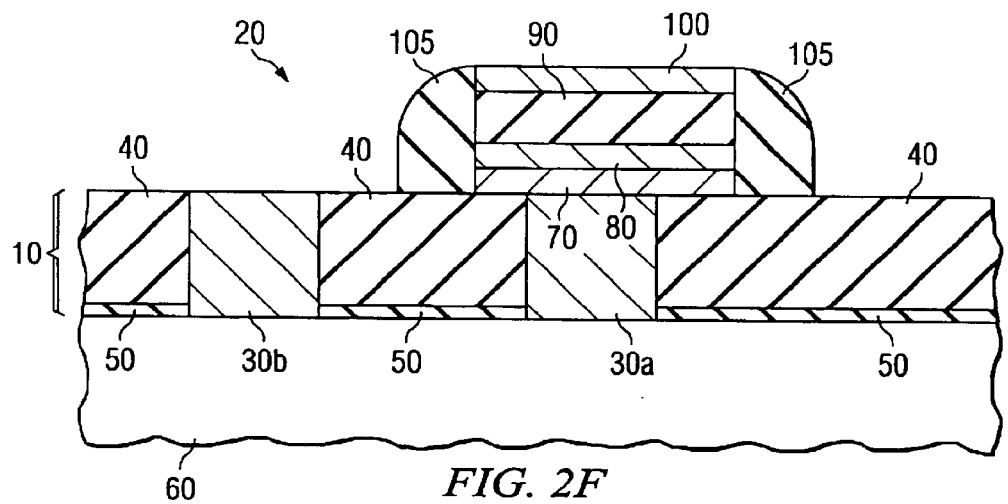

A standard blanket etch process is used to etch the dielectric layer 105 to create the capacitor sidewall structure shown in FIG. 2F. Due to the variability in the etch rate of the blanket etch process, the height of sidewalls 105 may vary from that shown in FIG. 2F. For example, the top of the sidewalls may be located below the top of the top electrode material 100. In fact, the sidewalls can be any height above the interface between the capacitor dielectric 90 and the top electrode layer 100 and still provide effective electrical isolation between the top and bottom electrodes of the capacitor.

Figure 2G:
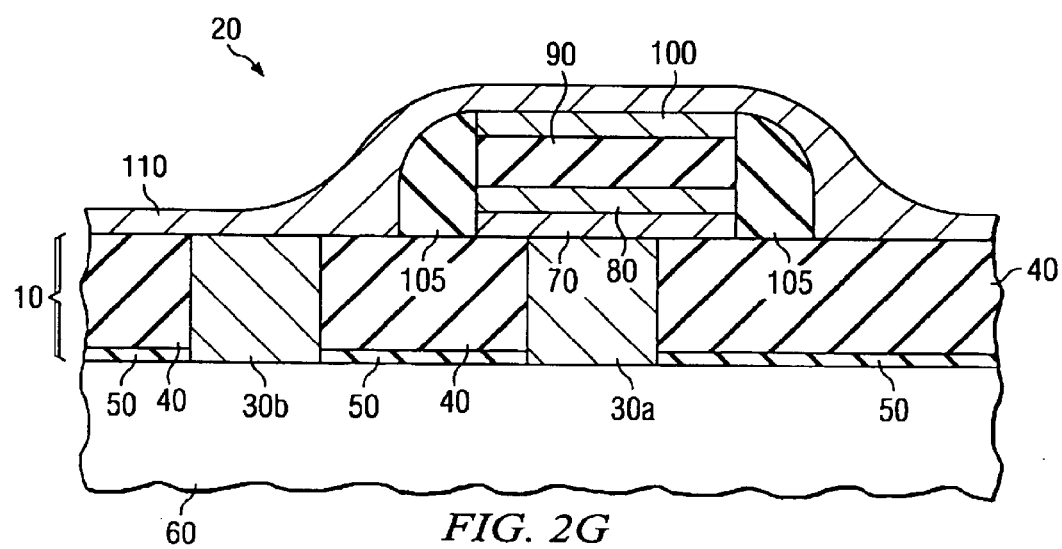

Next, a second layer 110 of TaN is formed over the semiconductor wafer, as shown in FIG. 2G. Once it's etched, this second layer of TaN will complete the top electrode structure. However, if the optional top electrode layer 100 was not formed (as noted above) then layer 110 will be the sole top electrode layer. The layer 110 of TaN may be formed using any standard manufacturing process such as PVD.

Figure 2H:
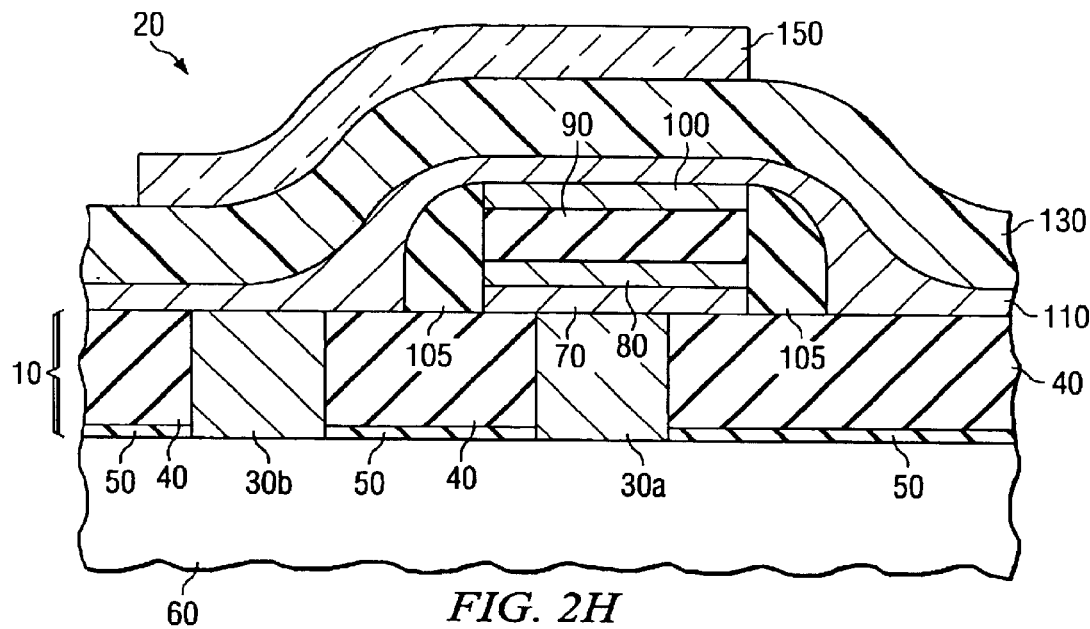

As shown in FIG. 2H another layer of photoresist 130 is formed over the layer of TaN 110 and a second mask 150 is used to pattern and etch the photoresist 130. This second mask 150 defines the structure of the layer of TaN 110.

Figure 2I:
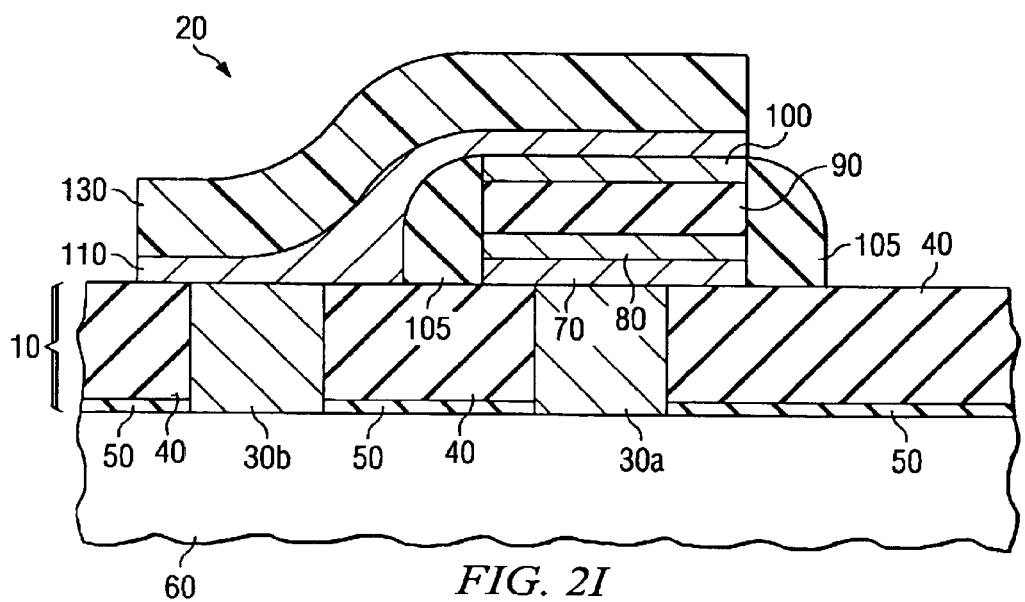

The photoresist 130 is patterned with the second mask 150 also using a lithography process. The patterned photoresist 130 is then used to etch the second layer of TaN 110, as shown in FIG. 2I. Any suitable etch process, such as fluorocarbon-based plasma etch with an Ar additive, may be used to etch the second layer of TaN 110. Together, layers 100 and 110 comprise the top electrode of the dual mask capacitor.

In the best mode application shown in FIG. 2I, the layer 110 of the top electrode extends beyond a second interconnect 30b of the top metal level 10. This structure ensures a robust electrical connection between the top electrode 110 and the second interconnect 30b. However, it is within the scope of this invention to use different structures for the top electrode layer 110. For example, the top electrode layer 110 may extend partially over the second interconnect 30b instead of past the second interconnect 30b as shown in FIG. 2I.

Next, the photoresist pattern 130 is removed using any known ashing process and the fabrication of the semiconductor wafer 20 continues with known manufacturing processes. In the best mode application a protective overcoat is formed immediately over the semiconductor wafer 20, as shown in FIG. 1A. The protective overcoat 120 preferably includes an etch stop layer comprised of SiC followed by an overcoat layer comprised of SiO$_2$. After creating the protective overcoat layer 120 and a bond-pad opening pattern-and-etch, any cap layer such as an electro-less Ni cap may be formed before finally packaging the integrated circuit.

Various modifications to the invention as described above are within the scope of the claimed invention. As an example, instead of using TaN and TiN for the dual layer bottom electrode, other suitable materials such as Ir or Ru, or material combinations may be used. The top electrode may also be comprised of any suitable material or material stack. For example, the top electrode may be comprised of a layer of TiAlON, Ru, Ir, or TiN, followed by the layer of TaN. Furthermore, instead of a dual layer bottom electrode or a dual layer top electrode, a single layer bottom or top electrode may be used. If a single layer bottom electrode or top electrode is used, it may be comprised of any suitable material such as TaN. The metal interconnects 30*a*, 30*b* in the best mode application are comprised of copper; however, other materials such as Al may be used. Moreover, cleaning steps were omitted from the above fabrication explanation; however, the semiconductor wafer should be cleaned as necessary during its manufacture.

While various embodiments of the present invention have been described above, it should be understood that they have been presented byway of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of fabricating a top metal level capacitor comprising:
   providing a semiconductor body having a plurality of metal interconnect levels including a top metal level, said top metal level having a first interconnect and a second interconnect;
   forming a bottom electrode over said top metal level, said bottom electrode coupled to said first interconnect;
   forming a capacitor dielectric over said bottom electrode;
   forming a first level top electrode over said capacitor dielectric;
   forming sidewalls at a perimeter of said top metal level capacitor; said sidewalls coupled to said top metal level, said bottom electrode, said capacitor dielectric, and at least a portion of said first level top electrode; and
   forming a second level top electrode coupled to said first level top electrode and said second interconnect.

2. The method of claim 1 wherein said bottom electrode is comprised of a layer of TaN and a layer of TiN.

3. The method of claim 1 wherein said capacitor dielectric is comprised of a high-k dielectric material.

4. The method of claim 3 wherein said capacitor dielectric is comprised of TaO$_x$.

5. The method of claim 1 wherein said first level top electrode is TiN and said second level top electrode is comprised of TaN.

6. The method of claim 1 wherein said sidewalls are comprised of SiN.

7. The method of claim 1 wherein said first interconnect and said second interconnect are comprised of Cu.

8. The method of claim 1 wherein said first interconnect and said second interconnect are power and ground rails.

9. A method of fabricating a top metal level capacitor comprising:
   providing a semiconductor body having a plurality of metal interconnect levels including a top metal level, said top metal level having a first interconnect and a second interconnect;
   forming a bottom electrode over said top metal level, said bottom electrode coupled to said first interconnect;
   forming a capacitor dielectric over said bottom electrode;
   forming sidewalls at a perimeter of said top metal level capacitor; said sidewalls coupled to said top metal level, said bottom electrode, and said capacitor dielectric; and
   forming a top electrode coupled to said capacitor dielectric and said second interconnect.

10. The method of claim 9 wherein said bottom electrode is comprised of a layer of TaN and a layer of TiN.

11. The method of claim 9 wherein said capacitor dielectric is comprised of a high-k dielectric material.

12. The method of claim 11 wherein said capacitor dielectric is comprised of TaO$_x$.

13. The method of claim 9 wherein said top electrode is comprised of a layer of TiN and a layer of TaN.

14. The method of claim 9 wherein said top electrode is comprised of a layer of TaN.

15. The method of claim 9 wherein said top electrode is comprised of a layer of TaN.

16. The method of claim 9 wherein said sidewalls are comprised of SiN.

17. The method of claim 9 wherein said first interconnect and said second interconnect are comprised of Cu.

18. The method of claim 9 wherein said first interconnect and said second interconnect are power and ground rails.

19. A method of fabricating a top metal level capacitor on a semiconductor wafer comprising:
   providing a semiconductor body having a plurality of metal interconnect levels including a top metal level, said top metal level having a first interconnect and a second interconnect;
   forming a layer of bottom electrode material over said top metal level;
   forming a layer of capacitor dielectric material over said layer of bottom electrode material;
   annealing said layer of capacitor dielectric material;
   forming a first layer of top electrode material over said semiconductor wafer;
   etching said semiconductor wafer using a first mask to form a material stack; said material stack including a bottom electrode coupled to said first interconnect, a capacitor dielectric coupled to said bottom electrode, and a partial first layer of top electrode coupled to said capacitor dielectric;
   forming a layer of insulative material over said semiconductor wafer;
   etching said layer of insulative material to form sidewalls at a perimeter of said material stack;
   forming a second layer of top electrode material over said semiconductor wafer; and
   etching said second layer of top electrode material using a second mask to form a complete top electrode coupled to said partial first layer of top electrode and said second interconnect.

20. The method of claim 19 further comprising forming a protective overcoat, including an etch stop layer, over said semiconductor wafer.

21. The method of claim 19 wherein said bottom electrode is comprised of a layer of TaN and a layer of TiN.

22. The method of claim 19 wherein said capacitor dielectric is comprised of a high-k dielectric material.

23. The method of claim 22 wherein said capacitor dielectric is comprised of $TaO_x$.

24. The method of claim 19 wherein said partial top electrode is comprised of TiN and said complete top electrode is comprised of TaN.

25. The method of claim 19 wherein said sidewalls are comprised of SiN.

26. The method of claim 19 wherein said first interconnect and said second interconnect are comprised of Cu.

27. The method of claim 19 wherein said first interconnect and said second interconnect are power and ground rails.

28. The method of claim 19 wherein said step of etching said semiconductor wafer to from a material stack comprises:
    forming a layer of photoresist over said semiconductor wafer;
    patterning said layer of photoresist using said first mask;
    etching said layer of photoresist to form a photoresist pattern;
    etching said first layer of top electrode material, said annealed layer of capacitor dielectric material, and said layer of bottom electrode material using said photoresist pattern; and
    ashing said photoresist patter.

29. The method of claim 19 wherein said step of etching said second layer of top electrode material comprises:
    forming a layer of photoresist over said semiconductor wafer;
    patterning said layer of photoresist using said second mask;
    etching said layer of photoresist to form a photoresist pattern;
    etching said second layer of top electrode material using said photoresist pattern; and
    ashing said photoresist patter.

30. A method of fabricating a top metal level capacitor on a semiconductor wafer comprising:
    providing a semiconductor body having a plurality of metal interconnect levels including a top metal level, said top metal level having a first interconnect and a second interconnect;
    forming a layer of bottom electrode material comprising a layer of TaN and a layer of TiN over said top metal level;
    forming a layer of capacitor dielectric material comprising a layer of $TaO_x$ over said layer of bottom electrode material;
    annealing said layer of $TaO_x$ to change it to a layer of higher oxygen content $TaO_x$;
    forming a first layer of top electrode material comprising TiN over said semiconductor wafer;
    etching said semiconductor wafer using a first mask to form a material stack; said material stack including a bottom electrode coupled to said first interconnect, a capacitor dielectric coupled to said bottom electrode, and a partial first layer of top electrode coupled to said capacitor dielectric;
    forming a layer of insulative material comprising SiN over said semiconductor wafer;
    etching said layer of SiN to form sidewalls at a perimeter of said material stack;
    forming a second layer of top electrode material comprising TaN over said semiconductor wafer; and
    etching said second layer of top electrode material using a second mask to form a complete top electrode coupled to said partial first layer of top electrode and said second interconnect.

31. The method of claim 30 further comprising forming a protective overcoat comprising $SiO_x$ and including an etch stop layer comprising SiC over said semiconductor wafer.

* * * * *